United States Patent
Banba

(10) Patent No.: US 8,198,006 B2
(45) Date of Patent: Jun. 12, 2012

(54) PROCESS FOR PRODUCING SEMICONDUCTOR DEVICE

(75) Inventor: Toshio Banba, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 183 days.

(21) Appl. No.: 12/602,156

(22) PCT Filed: Jun. 17, 2008

(86) PCT No.: PCT/JP2008/061385
§ 371 (c)(1),
(2), (4) Date: Apr. 1, 2010

(87) PCT Pub. No.: WO2008/156190
PCT Pub. Date: Dec. 24, 2008

(65) Prior Publication Data
US 2010/0183985 A1   Jul. 22, 2010

(30) Foreign Application Priority Data

Jun. 18, 2007 (JP) ................................. 2007-159671
Jun. 10, 2008 (JP) ................................. 2008-152020

(51) Int. Cl.
*G03F 7/00* (2006.01)
*G03F 7/004* (2006.01)
*G03F 7/40* (2006.01)

(52) U.S. Cl. ...................... 430/270.1; 430/311; 430/330

(58) Field of Classification Search .............. 430/270.1, 430/311, 330
See application file for complete search history.

(56) References Cited

U.S. PATENT DOCUMENTS

| | | | | |
|---|---|---|---|---|
| 6,541,178 B2* | 4/2003 | Jung et al. | ................. | 430/270.1 |
| 6,929,891 B2* | 8/2005 | Rushkin et al. | ................. | 430/18 |
| 6,960,420 B2* | 11/2005 | Komatsu | ................. | 430/270.1 |
| 7,378,229 B2* | 5/2008 | Endo et al. | ................. | 430/322 |
| 2004/0142275 A1 | 7/2004 | Komatsu | | |
| 2004/0229166 A1 | 11/2004 | Rushkin et al. | | |
| 2007/0099111 A1* | 5/2007 | Naiini et al. | ................. | 430/270.1 |

FOREIGN PATENT DOCUMENTS

| | | |
|---|---|---|
| JP | H01-46862 | 10/1989 |
| JP | H11-102069 | 4/1999 |
| JP | 2004-157248 | 6/2004 |
| JP | 2006-267145 | 10/2006 |

OTHER PUBLICATIONS

Extended European Search Report for corresponding EP Application No. 08777503.7-2203, Oct. 7, 2010.

* cited by examiner

*Primary Examiner* — Amanda C. Walke
(74) *Attorney, Agent, or Firm* — Ditthavong Mori & Steiner, P.C.

(57) ABSTRACT

A process for producing a semiconductor device includes a circuit formation step of forming circuit wiring on a semiconductor wafer using a chemically-amplified resist, and a cured film formation step of forming a cured film that protects the circuit wiring after forming the circuit wiring, the cured film being formed of a cured material of a photosensitive resin composition that comprises an alkali-soluble resin having a polybenzoxazole structure or a polybenzoxazole precursor structure, a compound that generates an acid upon exposure to light, and a solvent. The photosensitive resin composition substantially does not contain N-methyl-2-pyrrolidone. The process can suppress a T-top phenomenon or the like that may occur when forming a circuit on a semiconductor wafer using a chemically-amplified resist in the production of semiconductor devices.

4 Claims, 2 Drawing Sheets

PROCESS FOR PRODUCING SEMICONDUCTOR DEVICE

TECHNICAL FIELD

The present invention relates to a process for producing a semiconductor device.

BACKGROUND ART

A polybenzoxazole resin or a polyimide resin that has excellent heat resistance, superior electrical and mechanical properties, and the like has been used to produce a surface protective film or an interlayer dielectric of semiconductor devices. A positive-type photosensitive resin composition that contains a polybenzoxazole resin or a polyimide resin and a quinonediazide compound (photosensitizer) has been used to simplify the production process (Patent Document 1).

When producing a semiconductor device, a deposition step that forms an oxide film or the like, a lithography step that forms a circuit, and an impurity addition (implantation) step are repeated. The lithography step utilizes a chemically-amplified resist. After completion of the lithography step, a semiconductor wafer protective film is formed using a polybenzoxazole resin or a polyimide resin. Therefore, the chemically-amplified photoresist and the polybenzoxazole resin or the polyimide resin may be used in semiconductor production lines that are close together.

When using the chemically-amplified resist, a T-top phenomenon (i.e., the upper area of the pattern has a width larger than that of the lower area) or the like may occur. (Patent Document 1) H01-46862-B2

An object of the present invention is to provide a process for producing a semiconductor device that can suppress a T-top phenomenon or the like that may occur when forming a circuit on a semiconductor wafer using a chemically-amplified resist in the production of semiconductor devices.

DISCLOSURE OF THE INVENTION

According to the present invention, the above object can be achieved by the following process for producing a semiconductor device.

(1) A process for producing a semiconductor device comprising a circuit formation step of forming circuit wiring on a semiconductor wafer using a chemically-amplified resist, and a cured film formation step of forming a cured film that protects the circuit wiring after forming the circuit wiring, the cured film being formed of a cured material of a photosensitive resin composition that comprises an alkali-soluble resin having a polybenzoxazole structure or a polybenzoxazole precursor structure, a compound that generates an acid upon exposure to light, and a solvent, the photosensitive resin composition substantially not containing N-methyl-2-pyrrolidone.
(2) The process according to (1), wherein the content of N-methyl-2-pyrrolidone in the photosensitive resin composition is 1 wt % or less.
(3) The process according to (1), wherein the content of N-methyl-2-pyrrolidone in the photosensitive resin composition is 0.1 wt % or less.
(4) The process according to (1), wherein the content of N-methyl-2-pyrrolidone in the photosensitive resin composition is 0 wt % or less.

According to the present invention, a process for producing a semiconductor device that can suppress a T-top phenomenon that may occur when forming a circuit on a semiconductor wafer using a chemically-amplified resist, can be provided.

BEST MODE FOR CARRYING OUT THE INVENTION

The process for producing a semiconductor device according to the present invention is described below.

Figure 1:
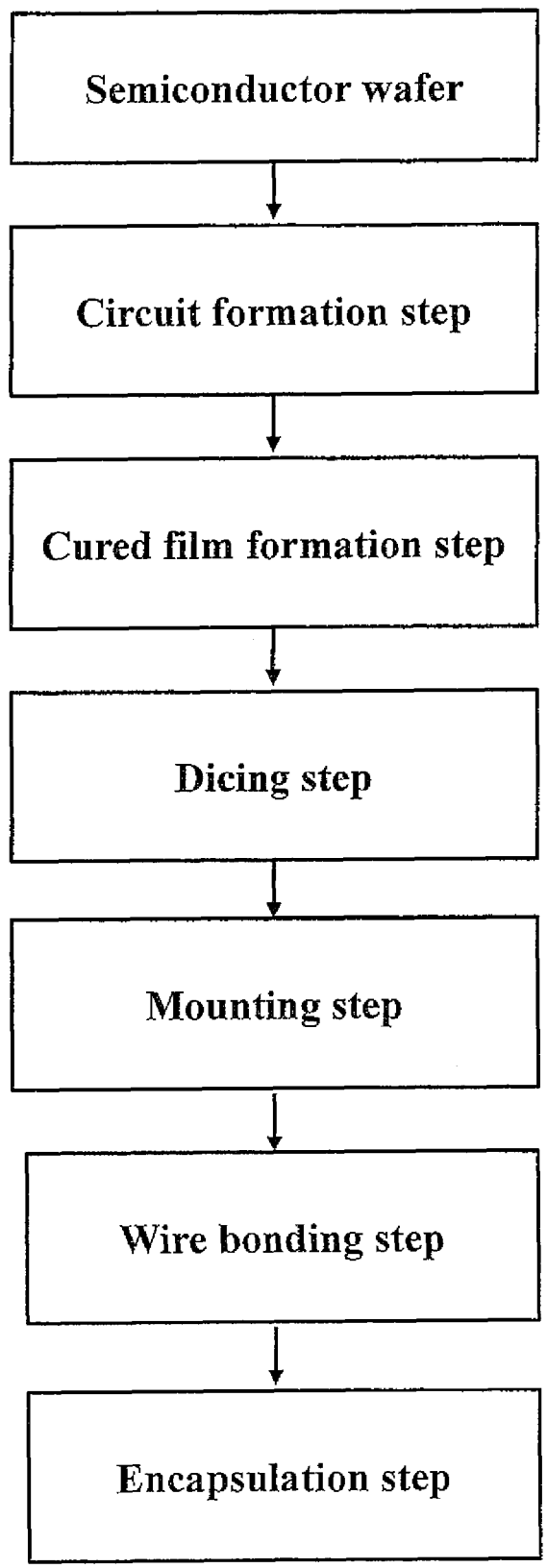
FIG. 1 is a flowchart showing semiconductor device production steps.

FIG. 1 is a flowchart showing the steps of the process for producing a semiconductor device.

As shown in FIG. 1, a semiconductor device is produced by a circuit formation step that provides a semiconductor wafer, and forms a circuit on the semiconductor wafer, a cured film formation step that forms a cured film that protects circuit wiring, a dicing step that dices the semiconductor wafer into semiconductor chips, a mounting step that mounts the semiconductor chip on a substrate, a wire bonding step that electrically connects the semiconductor chip to the substrate, and a encapsulation step that covers the semiconductor chip with a encapsulation resin.

The present invention is characterized in that the cured film formed by the cured film formation step is formed of a cured material of a photosensitive resin composition that includes an alkali-soluble resin having a polybenzoxazole structure or a polybenzoxazole precursor structure, a compound that generates an acid upon exposure to light, and a solvent, the photosensitive resin composition substantially not containing N-methyl-2-pyrrolidone.

A T-top phenomenon that may occur when using the chemically-amplified resist can be suppressed by the photosensitive resin composition that forms the cured film. The reason that the T-top phenomenon can be suppressed is considered to be as follows.

A basic compound contained in the air is involved in the T-top phenomenon that may occur when using the chemically-amplified resist. Specifically, an acid generated on the surface of the resist film upon exposure reacts with a basic compound contained in the air so that the acid is inactivated. Therefore, the amount of acid that is inactivated increases as the standing time before subjecting the resist film to post-exposure bake (PEB) increases, so that the solubility of the surface of the resist film decreases. N-methyl-2-pyrrolidone that is used as a solvent for the alkali-soluble resin having a polybenzoxazole structure or a polybenzoxazole precursor structure that forms the cured film is considered to cause the T-top phenomenon. Therefore, if the photosensitive resin composition substantially does not contain N-methyl-2-pyrrolidone, the amount of basic compound that causes the T-top phenomenon can be reduced.

Each step is described below.
(Circuit Formation Step)

In the circuit formation step, the chemically-amplified resist is applied to the semiconductor wafer. The chemically-amplified resist is then patterned, etched, and removed. This process is repeated to form a circuit.

Examples of the chemically-amplified resist include a composition prepared by mixing a base polymer (e.g., polyhydroxystyrene) in which a hydroxyl group is protected with a butoxycarbonyl (BOC) group or the like, a photoacid generator, and additives. The composition is alkali-insoluble, but becomes alkali-soluble when the photoacid generator is decomposed by exposure to ultraviolet rays to generate an acid so that the BOC group breaks.

(Cured Film Formation Step)

In the cured film formation step, the photosensitive resin composition is applied to the uppermost layer of the semiconductor wafer on which the circuit is formed by the circuit formation step. The photosensitive resin composition is patterned and heated to form a cured film. A semiconductor chip having a protection function can thus be produced.

The cured film formed by the cured film formation step is formed of a cured material of a photosensitive resin composition that includes an alkali-soluble resin having a polybenzoxazole structure or a polybenzoxazole precursor structure, a compound that generates an acid upon exposure to light, and a solvent, the photosensitive resin composition substantially not containing N-methyl-2-pyrrolidone (hereinafter may be referred to as "NMP"). This suppresses a T-top phenomenon that may occur when using the chemically-amplified resist.

The expression "substantially not containing NMP" refers to a case where the content of NMP in the photosensitive resin composition is 1 wt % or less, preferably 0.1 wt % or less, and particularly preferably 0 wt %, for example. The photosensitive resin composition does not contain NMP when the content of NMP is 0 wt %. If the content of NMP is within the above range, an increase in viscosity of the photosensitive resin composition can be suppressed in addition to effectively suppressing a T-top phenomenon.

Suppression of an increase in viscosity of the photosensitive resin composition when the photosensitive resin composition substantially does not contain NMP is considered to be caused by the following reason. A photosensitive diazoquinone compound used as a positive-type photosensitizer causes discoloration of the resin composition in the presence of a basic compound. This is considered to be because the quinonediazide compound is gradually decomposed. It is considered that the viscosity of the photosensitive resin composition increases due to decomposition of the quinonediazide compound.

The alkali-soluble resin has a polybenzoxazole structure or a polybenzoxazole precursor structure. The alkali-soluble resin may have other structures such as a polyimide structure, a polyimide precursor structure, or a polyamidate structure.

Examples of the compound that generates an acid upon exposure to light include quinonediazide compounds, onium salts, halogenated organic compounds, α,α-bis(sulfonyl)diazomethane compounds, α-carbonyl-α-sulfonyl-diazomethane compounds, sulfone compounds, organic ester compounds, organic acid amide compounds, organic acid imide compounds, and the like.

The content of the compound that generates an acid upon exposure to light is not particularly limited, but is preferably 1 to 50 parts by weight, and particularly preferably 5 to 30 parts by weight, based on 100 parts by weight of the alkali-soluble resin. If the content of the compound that generates an acid upon exposure to light is within the above range, the photosensitive resin composition has excellent photosensitivity, and the cured film has excellent properties.

Examples of the solvent include γ-butyrolactone, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol 3-monomethyl ether, methyl pyruvate, ethyl pyruvate, methyl-3-methoxypropionate, and the like. These solvents may be used either individually or in combination.

A photosensitive resin composition which substantially does not contain NMP may be produced by avoiding use of NMP as the solvent of the resin composition, or using a raw material that substantially does not contain NMP, for example.

NMP is generally used as a reaction solvent when synthesizing an alkali-soluble resin. After completion of the reaction, the product is re-precipitated in a poor solvent to obtain a resin, followed by purification and drying. In this case, NMP generally remains in the resin. In order to reduce the content of NMP, it is effective to dissolve the resin in a solvent other than NMP, followed by re-precipitation, purification, and drying. It is also effective to synthesize the alkali-soluble resin using a solvent other than NMP. This ensures that the resulting resin composition substantially does not contain NMP.

The photosensitive resin composition preferably contains a phenol compound. This makes it possible to implement patterning with high sensitivity without causing the resin (scum) to remain after development.

Examples of the phenol compound include compounds shown by the following formulas. Note that the phenol compound is not limited to the following compounds. These phenol compounds may be used either individually or in combination.

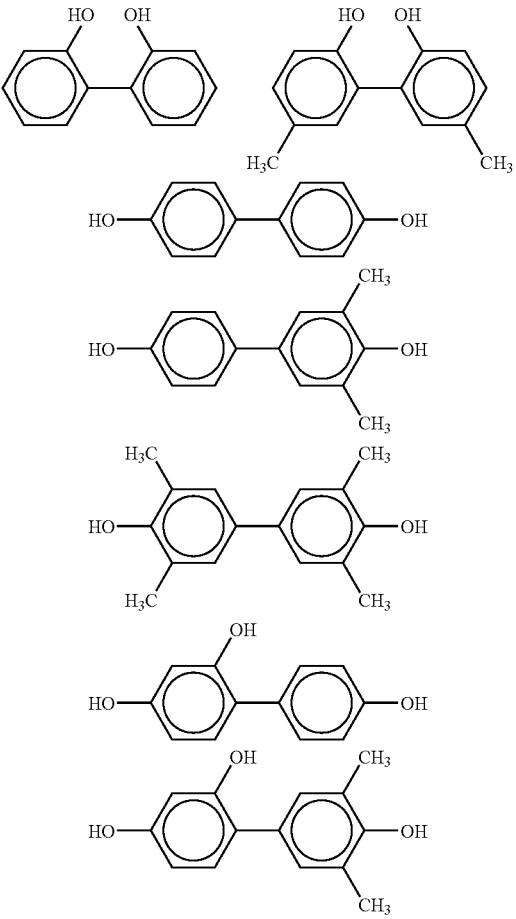

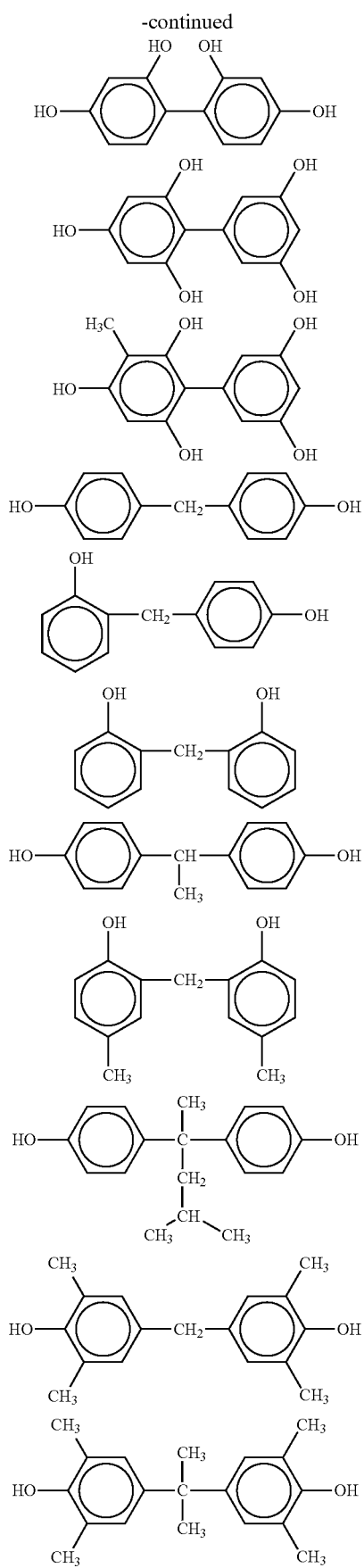
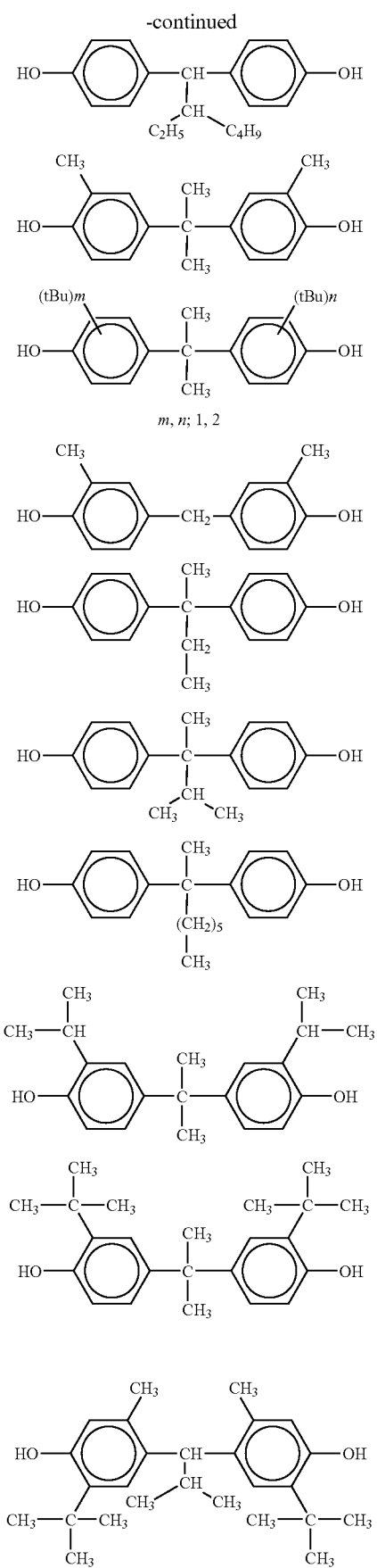

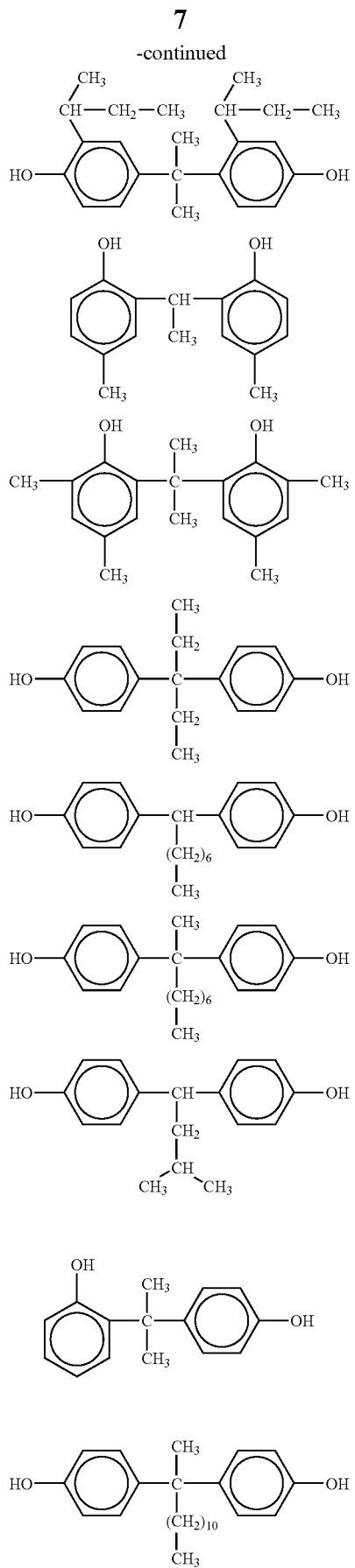
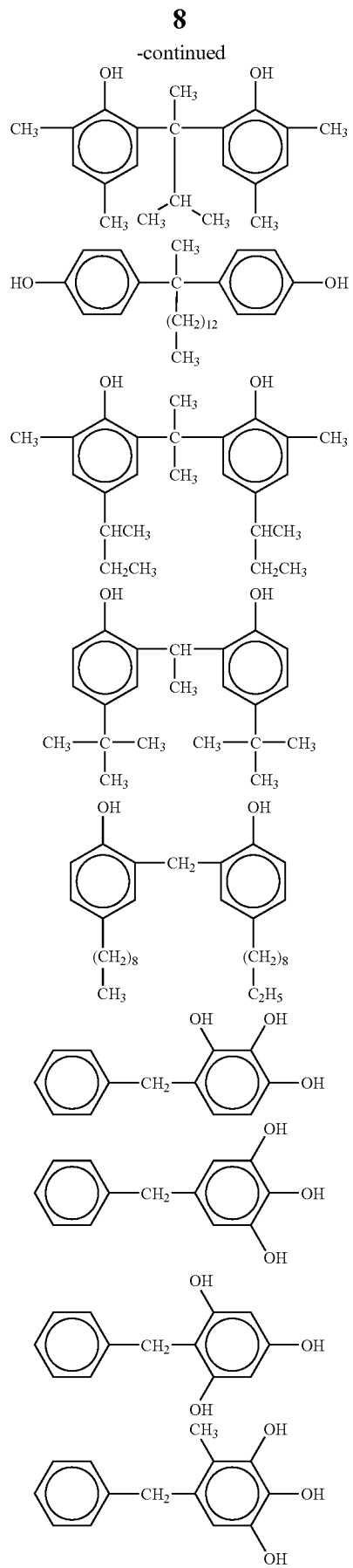

-continued
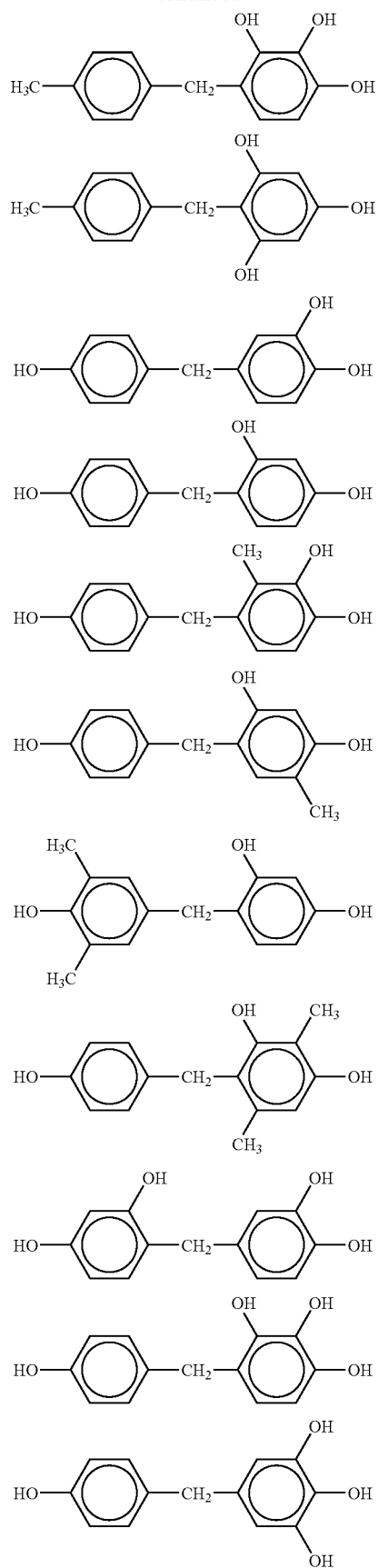
-continued
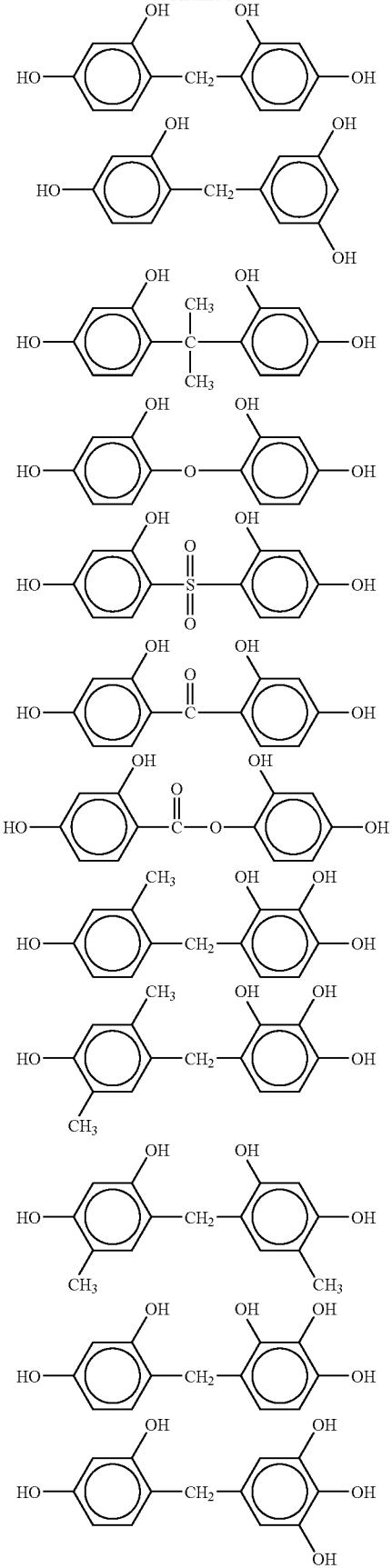

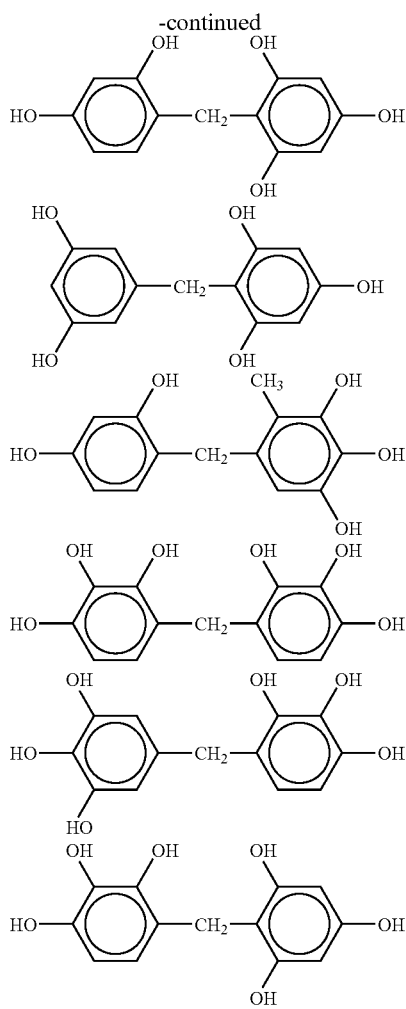

The phenol compound is preferably used in an amount of 0.5 to 30 parts by weight, and particularly preferably 1 to 20 parts by weight, based on 100 parts by weight of the alkali-soluble resin. If the content of the phenol compound is within the above range, the cured film formed of the photosensitive resin composition has excellent properties.

The photosensitive resin composition according to the present invention may further include additives such a leveling agent and a silane coupling agent, as required.

The photosensitive resin composition having the above composition is applied to the surface of the semiconductor wafer by a normal wafer process, patterned, and heated at 250° C. or higher to form a cured film.

(Dicing Step)

In the dicing step, the semiconductor wafer on which the cured film is formed is diced to obtain semiconductor chips.

For example, a dicing sheet is bonded to the side of the semiconductor wafer opposite to the side on which the cured film is formed, and a ring is disposed around the semiconductor wafer to secure the semiconductor wafer. The semiconductor wafer is then cut (diced) using a blade.

(Mounting Step)

In the mounting step, the dicing sheet is expanded using an expansion apparatus so that the diced semiconductor chips are separated at a given interval, and each semiconductor chip is picked up and placed on a substrate.

Specifically, the dicing sheet is cured by applying ultraviolet rays using an ultraviolet exposure apparatus in a state in which the semiconductor chips (semiconductor wafer) are positioned on the dicing sheet. This reduces the adhesion of the dicing sheet. The semiconductor chip (semiconductor wafer) can be easily picked up by thus reducing the adhesion of the dicing sheet to the semiconductor wafer. The semiconductor wafer is then placed in the expansion apparatus in a state in which the dicing sheet is bonded to the semiconductor wafer. The dicing sheet is expanded using the expansion apparatus so that the diced semiconductor chips are separated at a given interval. The semiconductor chip is then pushed up using a needle of an ejector head.

The semiconductor chip pushed up using the needle is picked up using a vacuum collet, air tweezers, or the like, and mounted on a given substrate or the like.

(Wire Bonding Step)

In the wire bonding step, a gold wire having a diameter of 25 μm is bonded to bonding pads of the semiconductor chip and the substrate or the like using an automatic wire bonder while applying heat and ultrasonic vibrations, for example.

(Encapsulation Step)

In the encapsulation step, a encapsulation resin composition in the form of tablets is injected into a mold at 180° C. using a low-pressure transfer molding machine, and molded to encapsulate the substrate or the like on which the semiconductor chip is mounted, for example. The molded product is post-cured at 175° C. for four hours.

Figure 2:
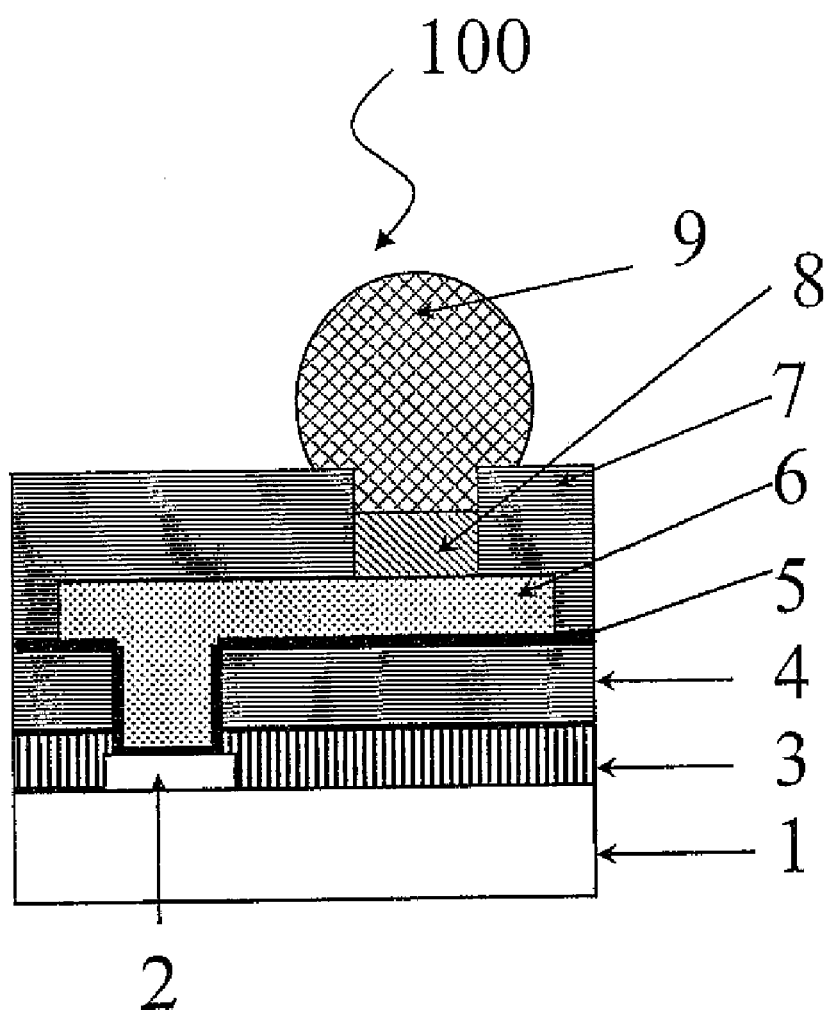
FIG. 2 is a cross-sectional view showing an example of a semiconductor device.

A semiconductor device shown in FIG. 2 is obtained by the above method.

FIG. 2 is an enlarged cross-sectional view showing a pad area of a semiconductor device according to the present invention that has a bump. In a semiconductor device 100 shown in FIG. 2, an input/output Al pad 2 is provided on a silicon substrate 1 on which a semiconductor chip and wiring are formed. A passivation film 3 is formed on the silicon substrate 1, and a via hole is formed in the passivation film 3. The photosensitive resin composition is applied to the passivation film 3, patterned and heated to form a buffer coat film 4 (cured film). A metal film 5 is formed to be connected to the Al pad 2. A wiring section 6 is provided on the side of the metal film 5 opposite to the side that faces the Al pad 2. An insulating film 7 is formed to cover the wiring section 6 and the exposed area of the metal film 5. A through-hole is formed in the insulating film 7, a barrier metal 8 that electrically connects the wiring section 6 and a solder bump 9 being provided in the through-hole.

EXAMPLES

The present invention is further described below by way of examples and a comparative example. Note that the present invention is not limited to the following examples.

Example 1

1. Synthesis of Alkali-Soluble Resin 1.1 Synthesis of Dicarboxylic Acid Derivative 258.2 g (1 mol) of diphenyl ether-4,4'-dicarboxylic acid and 270.3 g (2 mol) of 1-hydroxybenzotriazole were dissolved in 1500 g of NMP. 412.7 g (2 mol) of dicyclohexylcarbodiimide dissolved in 500 g of NMP was added dropwise to the solution while cooling the reaction system at 0 to 5° C. After the addition, the reaction system was allowed to return to room temperature, and stirred for 12 hours. After completion of the reaction, dicyclohexylcarbodiurea that precipitated was removed by filtration. Then, 2000 g of purified water was added dropwise to the filtrate. The precipitate was collected by filtration, sufficiently washed with isopropyl alcohol, and dried under vacuum to obtain the target dicarboxylic acid derivative.

1.2 Synthesis of Polybenzoxazole Precursor 217.2 g (0.593 mol) of hexafluoro-2,2-bis(3-amino-4-hydroxyphenyl)propane and 236.6 g (0.480 mol) of the dicarboxylic acid derivative were dissolved in 1000 g of γ-butyrolactone. The reaction system was heated to 80° C. and allowed to react for 12 hours. After the addition of 46.2 g (0.281 mol) of 5-norbornene-2,3-dicarboxylic anhydride dissolved in 230 g of γ-butyrolactone, the mixture was allowed to react for three hours. The reaction mixture was added to a water/IPA (=3/1) solution, and the precipitate was collected, sufficiently washed with purified water, and dried under vacuum to obtain the target polybenzoxazole precursor resin (A-1).

2. Synthesis of Compound that Generates Acid Upon Exposure to Light

A quinonediazide compound (B-1) shown by the following formula (manufactured by Toyo Gosei Co., Ltd.) was used as the compound that generates an acid upon exposure to light.

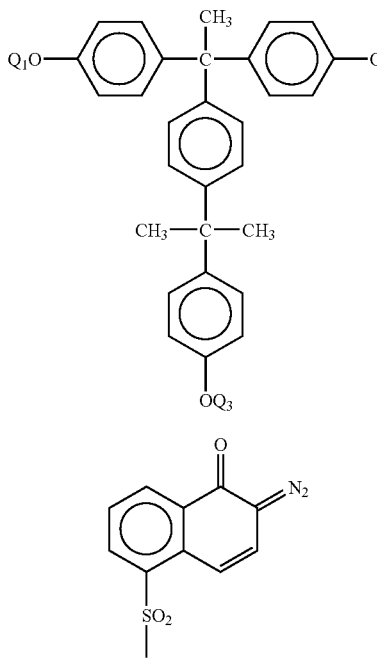

wherein 75% of $Q_1$, $Q_2$, and $Q_3$ are groups shown by the formula (I), and 25% of $Q_1$, $Q_2$, and $Q_3$ are hydrogen atoms.

3. Preparation of Photosensitive Resin Composition 24 g of the polybenzoxazole precursor resin (A-1) and 4.8 g of the compound (B-1) that generates an acid upon exposure to light were dissolved in 65 g of γ-butyrolactone. The solution was filtered through a fluororesin filter having a pore size of 0.2 μm to obtain a positive-type photosensitive resin composition. The NMP content in the positive-type photosensitive resin composition was 0.01 wt % or less (equal to or less than the detection limit). The NMP content was measured using a gas chromatography system manufactured by Shimadzu Corporation. The measurement conditions are given below.
Apparatus: GC-1700 manufactured by Shimadzu Corporation
Column: DB-5 manufactured by J & D (30 m×0.25 μm)

4. Production of Semiconductor Device

As shown in FIG. 2, an input/output Al pad 2 was provided on a silicon substrate 1 on which a semiconductor chip and wiring were formed. A passivation film 3 was formed on the silicon substrate 1, and a via hole was formed in the passivation film 3. The photosensitive resin composition was applied to the passivation film 3, patterned and heated to form a buffer coat film 4 (cured film). A metal film 5 was formed to be connected to the Al pad 2. A wiring section 6 was provided on the side of the metal film 5 opposite to the side facing the Al pad 2. An insulating film 7 was formed to cover the wiring section 6 and the exposed area of the metal film 5. A through-hole was formed in the insulating film 7, and a barrier metal 8 that electrically connects the wiring section 6 and a solder bump 9 was provided in the through-hole.

A semiconductor device 100 was thus produced in high yield, and showed high reliability.

Example 2

A dicarboxylic acid derivative was produced in the same manner as in Example 1. A polybenzoxazole precursor was produced in the same manner as in Example 1. except for using NMP instead of 1000 g of γ-butyrolactone. After the addition of 5-norbornene-2,3-dicarboxylic anhydride dissolved in 230 g of NMP, the mixture was allowed to react for three hours. The reaction mixture was added to a water/IPA (=3/1) solution, and the precipitate was collected, sufficiently washed with purified water, and dried under vacuum to obtain a polybenzoxazole precursor resin (A-4). 350 g of the resulting resin was dissolved in 1400 g of γ-butyrolactone. The solution was added to a water/IPA (=3/1) solution, and the precipitate was collected, sufficiently washed with purified water, and dried under vacuum to obtain the target polybenzoxazole precursor resin (A-2) that had been re-purified.

The polybenzoxazole precursor resin and the quinonediazide compound used in Example 1 were dissolved in γ-butyrolactone. The solution was filtered through a fluororesin filter having a pore size of 0.2 μm to obtain a positive-type photosensitive resin composition.

The NMP content in the photosensitive resin composition measured in the same manner as in Example 1 was 0.8 wt %.

Example 3

1. Synthesis of Alkali-Soluble Resin 1.1 Synthesis of Dicarboxylic Acid Derivative 244.0 g (0.945 mol) of diphenyl ether-4,4'-dicarboxylic acid and 255.4 g (1.890 mol) of 1-hydroxybenzotriazole were dissolved in 8000 g of γ-butyrolactone. 390.0 g (1.890 mol) of dicyclohexylcarbodiimide dissolved in 500 g of γ-butyrolactone was added dropwise to the solution while cooling the reaction system at 0 to 5° C. After the addition, the temperature of the reaction system was adjusted to 35° C., and the mixture was stirred for 12 hours. Then, the mixture was heated to 55° C. using an oil bath, and stirred for 20 minutes, followed by hot filtration. Dicyclohexylcarbodiurea that precipitated was removed by filtration. Then, 6000 g of purified water was added dropwise to the filtrate. The precipitate was collected by filtration, sufficiently washed with isopropyl alcohol, and dried under vacuum to obtain the target dicarboxylic acid derivative.

1.2 Synthesis of Polybenzoxazole Precursor 217.2 g (0.593 mol) of hexafluoro-2,2-bis(3-amino-4-hydroxyphenyl)propane and 236.6 g (0.480 mol) of the dicarboxylic acid derivative were dissolved in 1000 g of γ-butyrolactone. The reaction system was heated to 80° C. and allowed to react for 12 hours. After the addition of 46.2 g (0.281 mol) of 5-norbornene-2,3-dicarboxylic anhydride dissolved in 230 g of γ-butyrolactone, the mixture was allowed to react for three hours. The reaction mixture was added to a water/IPA (=3/1) solution, and the precipitate was collected, sufficiently washed with purified water, and dried under vacuum to obtain the target polybenzoxazole precursor resin (A-3).

2. Preparation of Photosensitive Resin Composition

The polybenzoxazole precursor resin and the quinonediazide compound used in Example 1 were dissolved in γ-butyrolactone. The solution was filtered through a fluororesin filter having a pore size of 0.2 μm to obtain a positive-type photosensitive resin composition.

The NMP content in the photosensitive resin composition measured in the same manner as in Example 1 was 0.01 wt % or less (equal to or less than the detection limit).

Comparative Example 1

A photosensitive resin composition was prepared in the same manner as in Example 2 using the polybenzoxazole precursor resin (A-4) that was not re-purified. The NMP content in the photosensitive resin composition was 2.6 wt %.

The semiconductor devices obtained in the examples and the comparative example were evaluated as follows. The evaluation items and methods are given below. The results are shown in Table 1.

1. Volatile NMP Amount

The NMP concentration when spin-coating the photosensitive resin composition was analyzed by thermal desorption-gas chromatograph mass spectrometry. Specifically, the photosensitive resin composition was applied to a silicon wafer. The silicon wafer was rotated at 800 rpm for five seconds and at 1500 rpm for 30 seconds. NMP was sampled by adsorption at a position about 10 cm above the rotating wafer. Analysis was conducted using the following apparatus to determine the NMP concentration.

<Apparatus>
Thermal desorption cooling trap manufactured by CHROMPACK (CP 4020)
Gas chromatograph-mass spectrometer manufactured by Agilent (5973N)

2. Viscosity Increase Rate

The photosensitive resin composition was stored in a yellow room at room temperature. The viscosity of the photosensitive resin composition was measured on the first day and the fourteenth day using a viscometer ("VISCOMETER-TV-22" manufactured by Told Sangyo Co., Ltd.). The increase rate of the viscosity measured on the fourteenth day with respect to the viscosity measured on the first day was calculated.

3. Resolution

The photosensitive resin composition was applied to a semiconductor wafer using a spin coater, and prebaked on a hot plate at 120° C. for four minutes to obtain a film having a thickness of about 7.5 μm. The film was exposed at a dose of 500 mJ/cm$^2$ using an i-line stepper ("4425i" manufactured by Nikon Corporation) through a mask manufactured by Toppan Printing Co., Ltd. (test chart No. 1 in which a line pattern and a space pattern having a width of 0.88 to 50 μm were drawn). After removing the exposed area by immersing the film in a 2.38% tetramethylammonium hydroxide aqueous solution for 30 seconds, the film was rinsed with purified water for 10 seconds. The semiconductor wafer was then observed using a microscope to determine the resolution.

4. Cured Film Properties (Tensile Elongation)

The photosensitive resin composition was applied to a semiconductor wafer so that the thickness after curing was about 10 μm. The photosensitive resin composition was cured in a clean oven at 150° C. for 30 minutes and at 320° C. for 30 minutes in an atmosphere having an oxygen concentration of 10 ppm or less.

The cured film was immersed in a 2% hydrogen fluoride aqueous solution to remove the cured film from the silicon wafer. The cured film was sufficiently washed with purified water, and dried in an oven at 60° C. for five hours. The cured film was cut in the shape of a strip having a width of 10 mm to obtain a tensile test specimen. The tensile elongation of the specimen was measured using a tensile tester.

TABLE 1

|  | Example 1 | Example 2 | Example 3 | Comparative Example 1 |
|---|---|---|---|---|
| Alkali-soluble resin | PBO*[1] precursor A-1 | PBO*[1] precursor A-2 | PBO*[1] precursor A-3 | PBO*[1] precursor A-4 |
| Compound that generates acid | Quinonediazide compound B-1 | Quinonediazide compound B-1 | Quinonediazide compound B-1 | Quinonediazide compound B-1 |
| Solvent | GBL*[2] | GBL*[2] | GBL*[2] | GBL*[2] |
| NMP content | <0.01 wt % | 0.8 wt % | <0.01 wt % | 2.6 wt % |
| Viscosity increase rate | 4% | 7% | 3% | 12% |
| Volatile NMP amount (T-top phenomenon suppression effect) | <10 ppb | 27 ppb | <10 ppb | 190 ppb |
| Resolution | 5 μm | 5 μm | 5 μm | 5 μm |
| Cured film properties (tensile elongation) | 51% | 48% | 55% | 25% |

*[1]Polybenzoxazole
*[2]γ-Butyrolactone

As shown in Table 1, the volatile NMP amount was small in Examples 1 to 3 since the NMP content was low. This suggests that a T-top phenomenon can be suppressed.

In Examples 1 to 3, the viscosity increase rate was also small. This indicates excellent storage stability.

In Example 1 and 2, excellent resolution and tensile elongation were also achieved.

1: Semiconductor wafer
2: Al pad
3: Passivation film
4: Buffer coat film
5: Metal film
6: Wiring section
7: Insulating film
8: Barrier metal
9: Solder bump
100: Semiconductor device

INDUSTRIAL APPLICABILITY

The present invention provides a process for producing a semiconductor device that ensures high productivity.

The present invention may also be applied when using a protective film in the production of liquid crystal displays and the like.

The invention claimed is:

1. A process for producing a semiconductor device comprising a circuit formation step of forming circuit wiring on a semiconductor wafer using a chemically-amplified resist, and a cured film formation step of forming a cured film that protects the circuit wiring after forming the circuit wiring,
    the cured film being formed of a cured material of a photosensitive resin composition that comprises polybenzoxazole precursor resin, a compound that generates an acid upon exposure to light, and a solvent, the photosensitive resin composition containing N-methyl-2-pyrrolidone in an amount of 1 wt % or less, and
    the polybenzoxazole precursor resin being obtained by reacting a dicarboxylic acid and 1-hydroxybenzotriazole in N-methyl-2-pyrrolidone to obtain a dicarboxylic acid derivative, and reacting the dicarboxylic acid derivative and a diamine in a solvent other than N-methyl-2-prryolidone.

2. The process according to claim 1, wherein the solvent other than N-methyl-2-pyrrolidone is γ-butyrolactone.

3. The process according to claim 1, wherein the content of N-methyl-2-pyrrolidone in the photosensitive resin composition is 0.1 wt % or less.

4. The process according to claim 1, wherein the content of N-methyl-2-pyrrolidone in the photosensitive resin composition is 0 wt %.

* * * * *